(12) United States Patent
Hu

(10) Patent No.: US 9,295,150 B2
(45) Date of Patent: Mar. 22, 2016

(54) METHOD FOR MANUFACTURING A PRINTED CIRCUIT BOARD

(71) Applicant: Zhen Ding Technology Co., Ltd., Tayuan, Taoyuan (TW)

(72) Inventor: Wen-Hung Hu, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 16 days.

(21) Appl. No.: 14/035,957

(22) Filed: Sep. 25, 2013

(65) Prior Publication Data
US 2014/0083757 A1    Mar. 27, 2014

(30) Foreign Application Priority Data
Sep. 26, 2012 (CN) .......................... 2012 1 0363035

(51) Int. Cl.
- *H05K 1/02* (2006.01)
- *H05K 3/46* (2006.01)
- *H05K 3/42* (2006.01)
- *H05K 1/11* (2006.01)

(52) U.S. Cl.
CPC ............ *H05K 1/0298* (2013.01); *H05K 3/4602* (2013.01); *H05K 1/115* (2013.01); *H05K 3/421* (2013.01); *H05K 2201/096* (2013.01); *H05K 2201/09509* (2013.01); *H05K 2201/09563* (2013.01); *Y10T 29/49165* (2015.01)

(58) Field of Classification Search
CPC . H05K 3/0011; H05K 3/3457; H05K 3/4611; H05K 3/462; H05K 3/4635; H05K 1/0298; H05K 1/115; H05K 3/4602; H05K 2201/09509; H05K 2201/09563; H05K 2201/096; Y10T 29/49165
See application file for complete search history.

(56) References Cited

U.S. PATENT DOCUMENTS 6,329,610 B1 * 12/2001 Takubo et al. ................ 174/264
2007/0263370 A1   11/2007 Niki

FOREIGN PATENT DOCUMENTS

| CN | 102202462 A |   | 9/2011 |
|----|-------------|---|--------|
| CN | 102307437 A | * | 1/2012 |
| TW | 200733841 B |   | 9/2007 |
| TW | 201005910 A |   | 2/2010 |
| TW | 201206287 A |   | 2/2012 |

* cited by examiner

*Primary Examiner* — Carl Arbes
(74) *Attorney, Agent, or Firm* — Novak Druce Connolly Bove + Quigg LLP

(57) ABSTRACT

A printed circuit board includes a first, second, and third dielectric layers, and a first, second, and third trace layers. The first trace layer and the second trace layer are formed on opposite surfaces of the first dielectric layer. The second dielectric layer is formed on the second trace layer, a first blind hole is defined in the first surface and terminated at a position in the first dielectric layer, a first conductive via is formed in the first blind hole. A second blind hole is formed in the second dielectric layer and the first dielectric layer. A second conductive via is formed in the second blind hole. The third trace layer is electrically connected with the second conductive via. The first trace layer is electrically connected with the second trace layer through the first conductive via and the second conductive via.

7 Claims, 20 Drawing Sheets

METHOD FOR MANUFACTURING A PRINTED CIRCUIT BOARD

BACKGROUND

1. Technical Field

The present disclosure generally relates to printed circuit boards (PCBs), and particularly relates to manufacturing of printed circuit boards and a method for manufacturing the printed circuit board.

2. Description of Related Art

To accommodate development of miniaturized electronic products with multiple functions, printed circuit boards are widely used.

A PCB needs a plurality of conductive vias for electrically connected two or more trace layers. In a method of manufacturing the PCB, firstly, a through hole is defined in a substrate. The substrate includes a dielectric layer, a first copper foil layer and a second copper foil layer. Secondly, a conductive via is formed in the though hole. Thirdly, a first trace layer and a second trace layer are formed on two opposite surfaces of the dielectric layer. Fourthly, an insulating layer is laminated on the second trace layer, and a blind hole is formed in the insulating layer. The conductive via is exposed in the blind hole. As the blind hole must be aligned with the conductive via, when forming the second trace layer, a hole ring surrounding the through hole is formed in the second trace layer. The outer diameter of the hole ring is larger that the diameter of the through hole. Accordingly, a distribution density of the traces in the second trace layer is smaller. Furthermore, as a process of forming the conductive via and a process of forming a plated through hole are different, the cost of manufacturing the printed circuit board is high.

What is needed therefore is a printed circuit board, and a method for manufacturing the printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing a printed circuit board in first embodiment includes the following steps.

Figure 1:
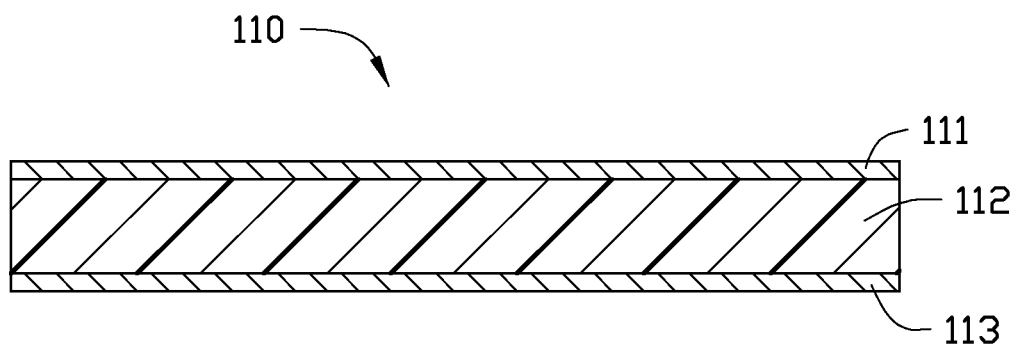
FIG. 1 is a schematic, cross-sectional view of a core substrate including a first dielectric layer according to a first exemplary embodiment.

FIG. 1 shows step 1, in which a core substrate 110 is provided. The core substrate 110 may be a copper clad laminate. The core substrate 110 includes a first copper foil layer 111, a first dielectric layer 112, and a second copper foil layer 113. The first and second copper foil layers 111, 113 are formed on two opposite surfaces of the first dielectric layer 112.

Figure 2:
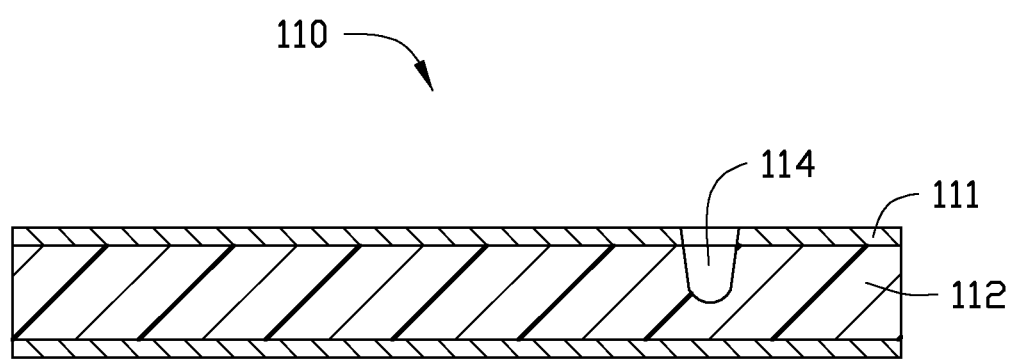
FIG. 2 shows a first blind hole defined in the core substrate of FIG. 1.

FIG. 2 shows step 2, in which at least one blind hole 114 is defined in the core substrate 110.

The first blind hole 114 can be formed by a laser ablation process. The first blind hole 114 runs through the first copper foil layer 111 and a portion of first dielectric layer 112 adjacent to the first copper foil layer 111. A depth of the first blind hole 114 in the first dielectric layer 112 is in a range from about one half to one three quarters of the thickness of the dielectric layer 112. A number of the first blind hole 114 may be one, and also may be two or more than two.

Figure 3:
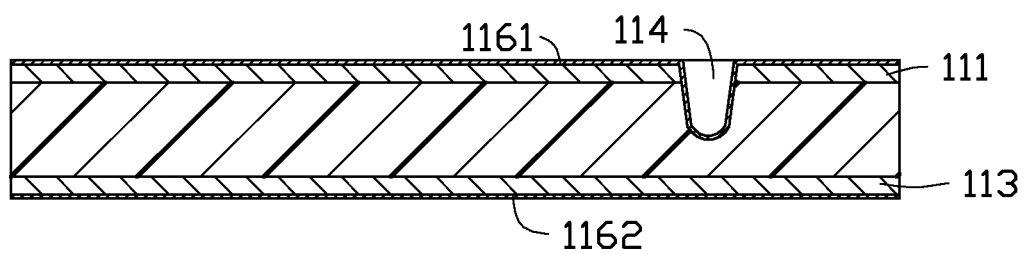
FIGS. 3-7 show a first conductive via formed in the first blind hole, and a first and second trace layer formed on two opposite surfaces of the first dielectric layer of FIG. 2.
Figure 4:
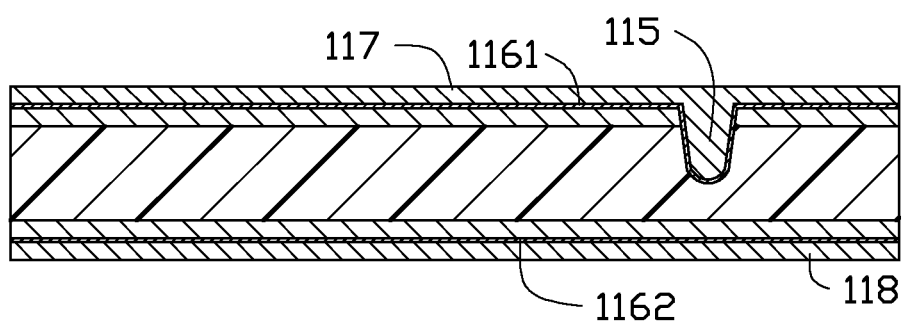
Figure 5:
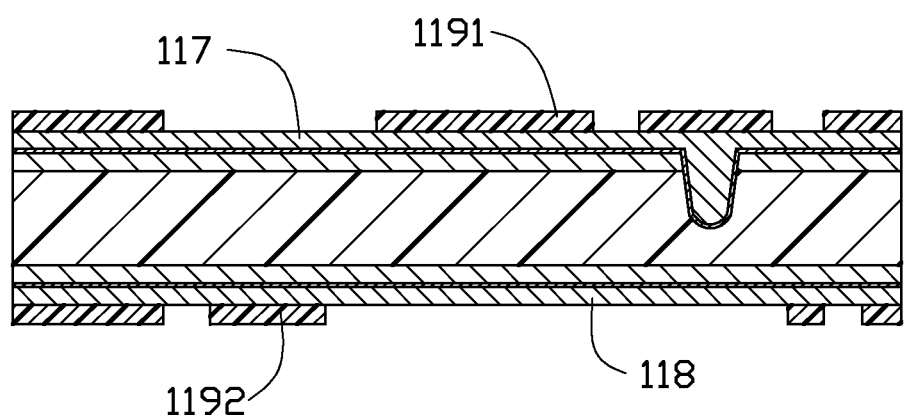
Figure 6:
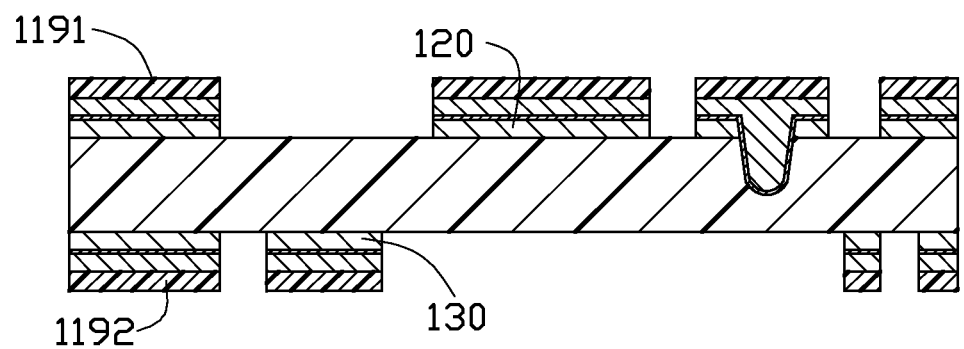
Figure 7:
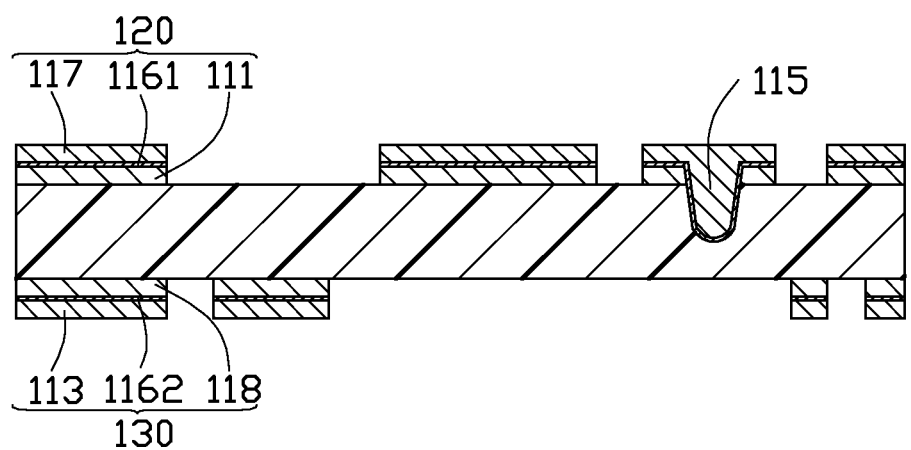

FIG. 3 shows step 3, in which first conductive via 115 is formed in the first blind hole 114, and first and second trace layers 120, 130 are formed on the two opposite surfaces of the first dielectric layer 112.

The first conductive via 115, the first trace layer 115, and a second trace layer 116 are formed by a method below:

Firstly, a first seed layer 1161 is formed on the inner wall of the first blind hole 114 and on a surface of first copper foil layer 111 facing away from the first dielectric layer 112, and a second seed layer 1162 is formed on a surface of the second copper foil layer 113 facing away from the first dielectric layer 112. The first seed layer 1161 and the second seed layer 1162 can be formed by an electro-less plating copper process.

Secondly, a first electro-plating layer 117 is formed on the first copper foil layer 117, which is on the first copper foil layer 111. A second electro-plating layer 118 is formed on the second seed layer 1162. A first conductive via 115 is formed on the first seed layer 1161 in the first blind hole 114.

Finally, a first trace layer 120 is formed by selectively removing portions of the first copper foil layer 111 and portions of the first electro-plating layer 117, a second trace layer 130 is formed by selectively removing portions of the second copper foil layer 113 and portions of the second electro-plating layer 118 using a photolithography process and a chemical etching process. In detail, a first photoresist pattern 1191 complementary to the first trace layer 120 is formed on the first electro-plating layer 117, and a second photoresist pattern 1192 complementary to the second trace layer 130 is formed on the second electro-plating layer 118. Then, a first trace layer 120 is formed by selectively removing portions of the first copper foil layer 111 and portions of the first electro-plating layer 117 uncovered by the first photo-resist pattern 1191, and a second trace layer 130 is formed by selectively removing portions of the second copper foil layer 113 and portions of the second electro-plating layer 118 uncovered by the second photo-resist pattern 1192 using a photolithography process and a chemical etching process. Lastly, the first and second photo-resist patterns 1191, 1192 are removed.

In the present embodiment, both the first trace layer 120 and the second trace layer 130 include a number of traces. There is no trace aligned with the first blind hole 114 in the second trace layer 130.

Figure 8:
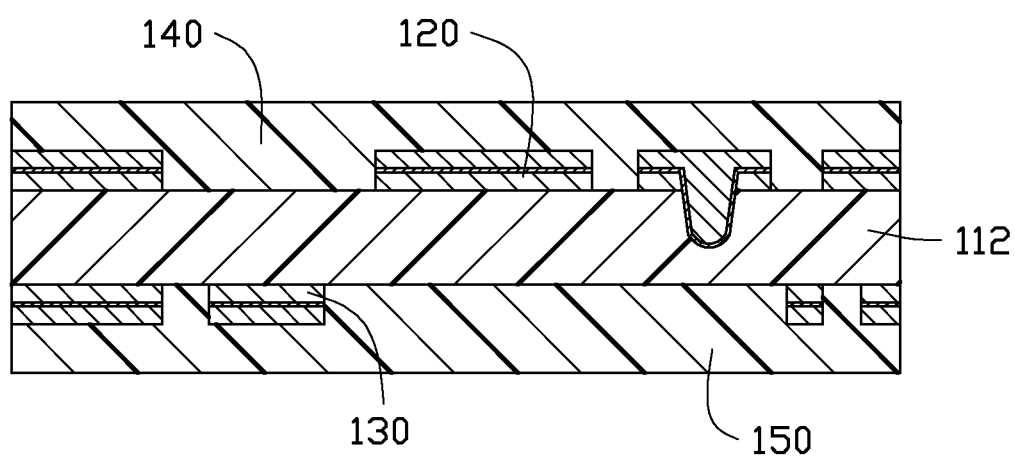
FIG. 8 shows a third dielectric layer formed on the first trace layer and a second dielectric layer formed on the second trace layer of FIG. 7.

FIG. 8 shows step 4, in which a third dielectric layer 140 is laminated on the first trace layer 120 and portions of the first dielectric layer 112 exposed from gaps in the first trace layer 120. A second dielectric layer 150 is laminated on the second trace layer 130 and portions of the first dielectric layer 111 exposed from gaps in the second trace layer 130.

Figure 9:
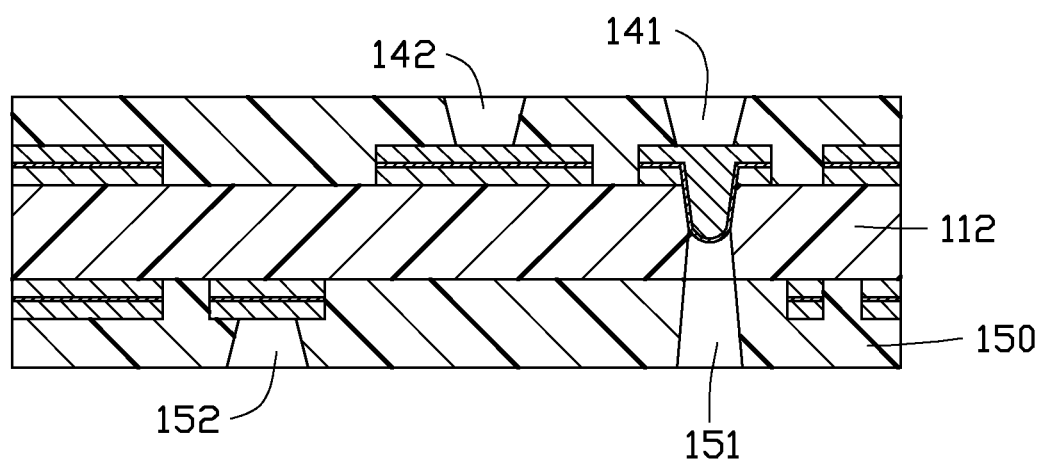
FIG. 9 shows a second blind hole and a third blind hole defined in the third dielectric layer, and a fourth blind hole and a fifth blind hole defined in the second dielectric layer of FIG. 3.

FIG. 9 shows step 5, in which at least one third blind hole 141 and at least one fourth blind hole 142 are defined in the third dielectric layer 140. Each third blind hole 141 is aligned with a first conductive via 115. The at least one fourth blind hole 142 is aligned with portions of the traces of the first trace layer 120. The fourth blind holes 142 and the third blind holes pass through the third dielectric layer 140. A second blind hole 151 is defined in the second dielectric layer 150 and the first dielectric layer 112. The second blind hole 151 communicates with a bottom portion of the first blind hole 114. At least one fifth blind hole 152 is defined in the second dielectric layer 150. The at least one fifth blind hole 152 is aligned with traces of the second trace layer 130.

The second blind hole 151, the third blind hole 141, the fourth blind hole 142, and the fifth blind hole 152 may be formed by a laser ablation process. One end portion of the first conductive via 115 is exposed in the second blind hole 151. Another opposite end portion of the first conductive via 115 is exposed in the third blind hole 141.

Figure 10:
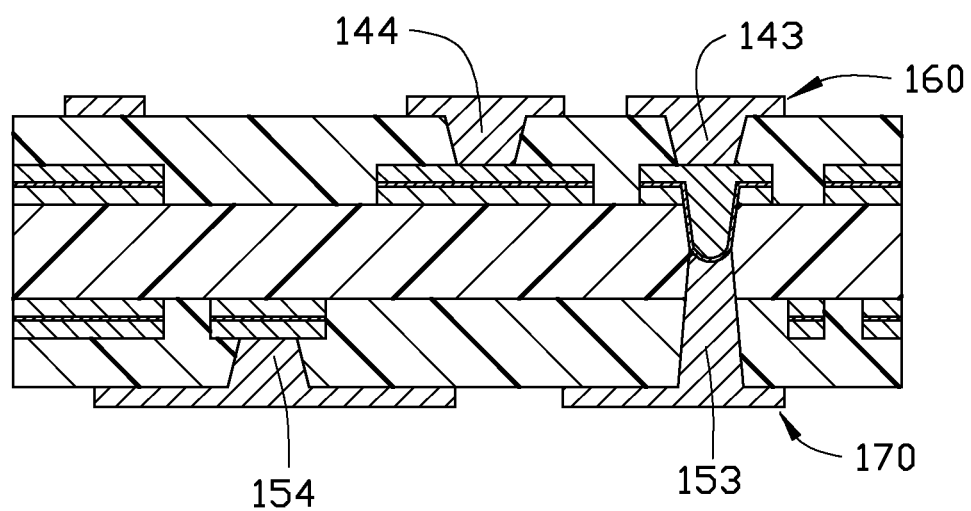
FIG. 10 shows a second conductive via formed in the second blind hole, a third conductive via formed in the third blind hole, a fourth conductive via formed in the fourth blind hole, a third trace layer formed on the third dielectric layer, and a fourth trace layer formed on the second dielectric layer of FIG. 5.

FIG. 10 shows step 6, in which each third conductive via 143 is formed in one third blind hole 141. Each fourth conductive via 144 is formed in one fourth blind hole 142. A fourth trace layer 160 is formed on the third dielectric layer 140. The first trace layer 120 and the fourth trace layer 160 electrically communicate through the third conductive via 143 and the fourth conductive via 144. Each second conductive via 153 is formed in one second blind hole 151, the second conductive via 153 contacts and is electrically connected with the first conductive via 115. Each fifth conductive via 154 is formed in a fifth blind hole 152. A third trace layer 170 is formed on the second dielectric layer 150. The second trace layer 130 and the third trace layer 170 electrically communicate with each other through the fifth conductive via 154. The first conductive via 115 together with the second conductive via 153 corporately formed a blind via 101. The first trace layer 120 and the third trace layer 170 are electrically connected with each other through the blind via 101. The fourth trace layer 160 and the third trace layer 170 are electrically connected with each other through the blind via 101, together with the third conductive via 143.

Figure 11:
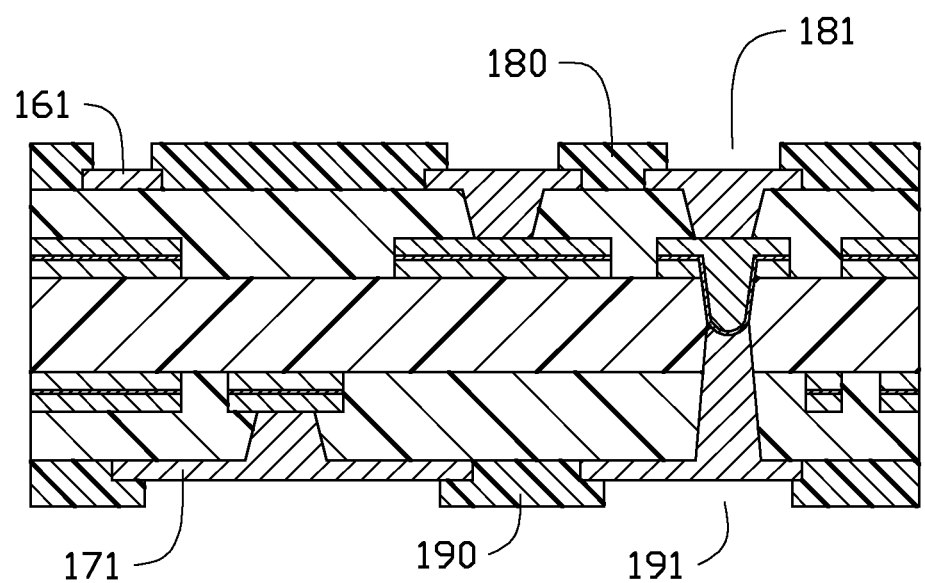
FIG. 11 shows solder masks formed on the third trace layer and the fourth trace layer of FIG. 6.

FIG. 11 shows step 7, in which a first solder mask layer 180 is formed on a surface of the third dielectric layer 140 and a surface of the fourth trace layer 160. A number of first openings 181 are defined in the first solder mask layer 180. Portions of the fourth trace layer 160 exposed in the first openings 181 form a number of first connecting pads 161. A second mask layer 190 is formed on a surface of the second dielectric layer 150 and on a surface of the third trace layer 170. A number of second openings 191 are defined in the second solder mask layer 190. Portions of the third trace layer 170 exposed in the second openings 191 form a number of second connecting pads 171.

Figure 12:
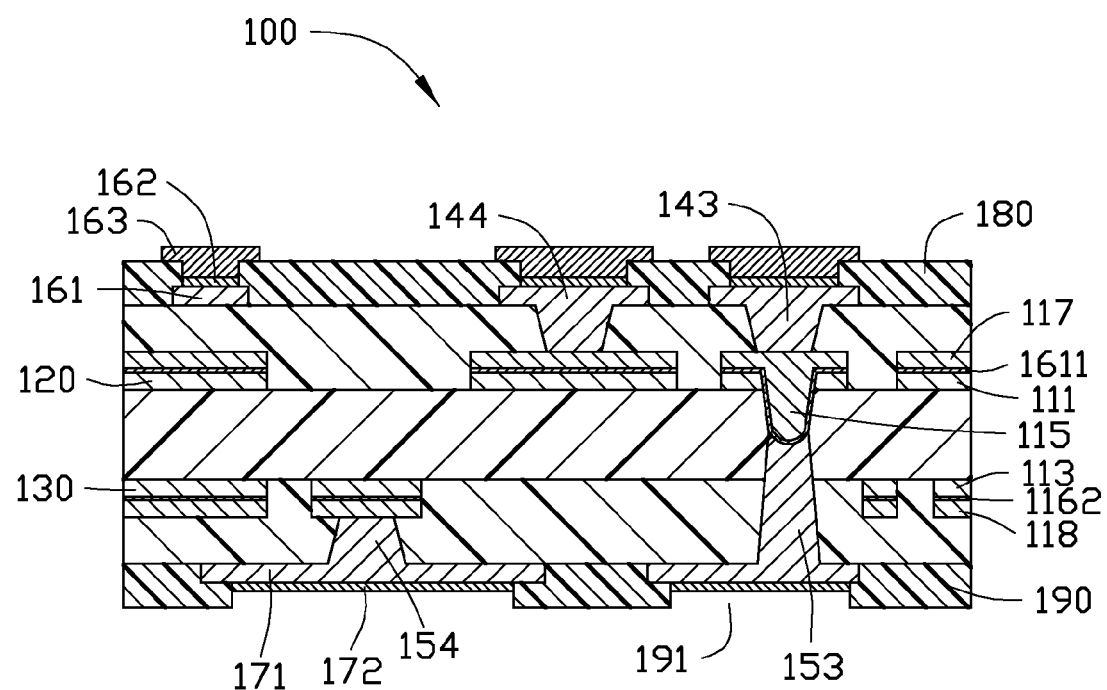
FIG. 12 is a schematic, cross-sectional view of a printed circuit board according to the first exemplary embodiment.

FIG. 12 shows step 8, in which a first protection layer 162 is formed on the first connecting pads 161, and a solder bump 163 is formed on the first protection layer 162 on each first connecting pad 161. The solder bump 163 protrudes out of the first solder mask layer 180. A second protection layer 172 is formed on the second connecting pads 171.

A material of the first and second protection layers 161, 171 may be tin, silver, gold, nickel, palladium, a single layer structure made of an alloy of such metals, or a multilayer structure made of a combination of such metals, for example. The first and second protection layers 161, 171 may be made of organic solderable preservative. When the first and second protection layers 161, 171 are made of metal, the first and second protection layers 161, 171 may be formed by electro-plating. When the first and second protection layers 161, 171 are made of organic solderable preservative, the first and second protection layers 161, 171 may be formed chemically.

A material of the solder bump 160 may be tin, copper, or an alloy of such metals.

A printed circuit board 100 is obtained by the above method as shown in FIG. 12. The printed circuit board 100 includes the first dielectric layer 112, the second dielectric layer 150, the third dielectric layer 140, the first trace layer 120, the second trace layer 130, the third trace layer 170 and the fourth trace layer 160.

The first trace layer 120 and the second trace layer 130 are formed on two opposite surfaces of the first dielectric layer 112. The third dielectric layer is formed on the surface of first trace layer 120 and the surface of the first dielectric layer 110 facing away from the second trace layer 130. The second dielectric layer 150 is formed on the surface of the second trace layer 130 and the surface of the first dielectric layer 112 facing away from the first trace layer 120.

The first trace layer 120 includes the first copper foil layer 111, the first seed layer 1161, and the first electro-plating layer 117. The first copper foil layer 111 contacts the first dielectric layer 112, and the first electro-plating layer contacts the third dielectric layer 140. The first seeds layer 1161 is sandwiched between the first copper foil layer 111 and the first electro-plating layer 117. The second trace layer 130 includes the second copper foil layer 113, the second seed layer 1162, and the second electro-plating layer 118. The second copper foil layer 113 contacts the first dielectric layer 112. The second electro-plating layer 118 contacts the second dielectric layer 150.

It can be understood, if the first copper foil layer 111 and the second copper foil layer 113 are removed before forming the first trace layer 120 and the second trace layer 130, the first trace layer 120 may not include the first copper foil layer 111, and the second trace layer 130 may not include the second copper foil layer 113.

The fourth trace layer 160 is formed on the surface of the dielectric layer 140 facing away from the first dielectric layer 112. The third trace layer 170 is formed on the surface of the second dielectric layer 150 facing away from the first dielectric layer 112.

The first blind hole 114 is defined in the first dielectric layer 112 adjacent to the third dielectric layer 140. The first blind hole 114 does not pass through the first dielectric layer 112. The first conductive via 115 is formed in the first blind hole 114. A second blind hole 151 is defined in the second dielectric layer 150 and the first dielectric layer 112 adjacent to the second dielectric layer 150. The second blind hole 151 is aligned with the first blind hole 114. The first blind hole 114 communicates with the second blind hole 114. The second conductive via 153 is formed in the second blind hole 151 and is electrically connected with the first conductive via 115. The first conductive via 115 is electrically connected with the first trace layer 120, and the second conductive via 151 is electrically connected with the third trace layer 170, such that the first trace layer 120 and the third trace layer 170 is electrically connected with each other through the first conductive via 115 and the second conductive via 151.

The third blind hole 141 and the fourth blind hole 142 are defined in the third dielectric layer 140. The third blind hole 141 is aligned with a first conductive via 115. The fourth blind holes 142 are aligned with the traces of the first trace layer 120. Each third conductive via 143 is formed in one third blind hole 141. Each fourth conductive via 144 is formed in one fourth blind hole 142. A fourth trace layer 160 is formed on the third dielectric layer 140. The first trace layer 120 and the fourth trace layer 160 electrically communicate through the third conductive via 143 and the fourth conductive via 144. Each second conductive via 153 is formed in one second blind hole 151, the second conductive via 153 contacting and electrically connected with the first conductive via 115. Each fifth conductive via 154 is formed in a fifth blind hole 152. A third trace layer 170 is formed on the second dielectric layer 150. The second trace layer 130 and the third trace layer 170 electrically communicate through the fifth conductive via 154. The first conductive via 115 together with the second conductive via 153 corporately form a blind via 101. The first trace layer 120 and the third trace layer 170 is electrically connected with each other through the blind via 101. The fourth trace layer 160 and the third trace layer 170 is electrically connected with each other through the blind via 101, together with the third conductive via 143.

The printed circuit board 100 further includes the first solder mask layer 180, the second solder mask layer 190, the first protection layer 162, the solder bumps 163 and the second protection layer 172. A number of first openings 181 are defined in the first solder mask layer 180. Portions of the fourth trace layer 160 which are exposed in the first openings 181 form a number of first connecting pads 161. A second mask layer 190 is formed on a surface of the second dielectric layer 150 and on a surface of the third trace layer 170. A number of second openings 191 are defined in the second solder mask layer 190. Portions of the third trace layer 170 which are exposed in the second openings 191 form a number of second connecting pads 171.

The first protection layer 162 is formed on the first connecting pads 161, and the solder bump 163 is formed on the first protection layer 162 on each first connecting pad 161. The solder bump 163 protrudes out of the first solder mask layer 180. The second protection layer 172 is formed on the second connecting pads 171.

A material of the first and second protection layers 161, 171 may be tin, silver, gold, nickel, palladium, a single layer structure made of an alloy of such metals, or a multilayer structure made of a combination of such metals, for example. The first and second protection layers 161, 171 may be made of organic solderable preservative. When the first and second protection layers 161, 171 are made of metal, the first and second protection layers 161, 171 may be formed by electroplating. When the first and second protection layers 161, 171 are made of organic solderable preservative, the first and second protection layers 161, 171 may be formed chemically. A material of the solder bump 160 may be tin, copper, or an alloy of such metals.

It can be understood, the printed circuit board 100 may not include the third dielectric layer 140, the fourth trace layer 160, and the first solder mask layer 180.

A method for manufacturing a printed circuit board in a second embodiment includes the following steps.

Figure 13:
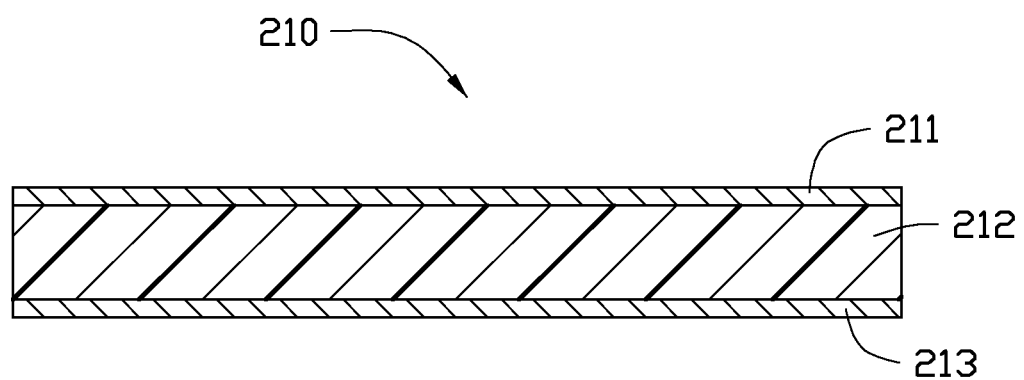
FIG. 13 is a schematic, cross-sectional view of a core substrate including a dielectric layer according to a second exemplary embodiment.

FIG. 13 shows step 1 in which a core substrate 210 is provided. The core substrate 210 may be a copper clad laminate. The core substrate 210 includes a first copper foil layer 211, a first dielectric layer 212, and a second copper foil layer 213. The first and second copper foil layers 211, 213 are formed on two opposite surfaces of the first dielectric layer 212.

Figure 14:
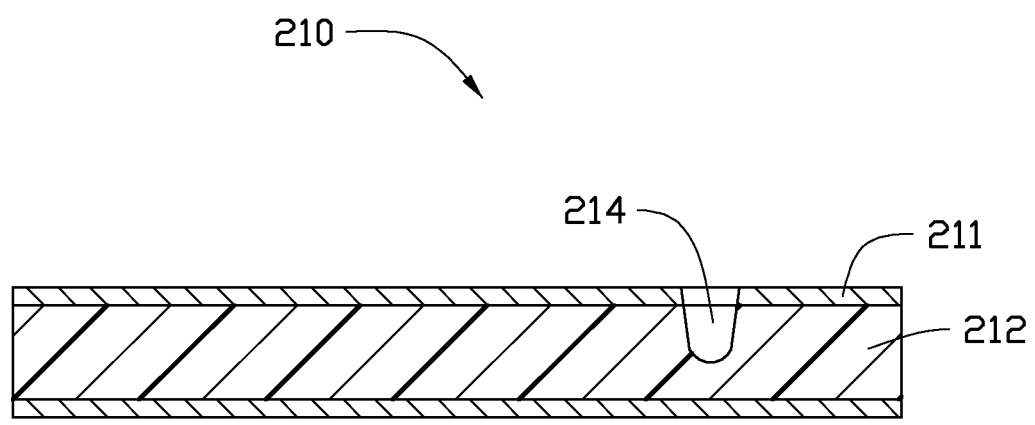
FIG. 14 shows a first blind hole defined in the core substrate of FIG. 12.
Figure 15:
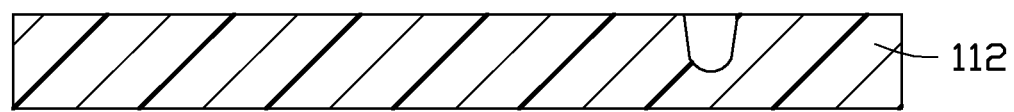
FIGS. 15-19 show a first conductive via formed in the first blind hole, and a first and second trace layer formed on two opposite surfaces of the first dielectric layer of FIG. 14.
Figure 16:
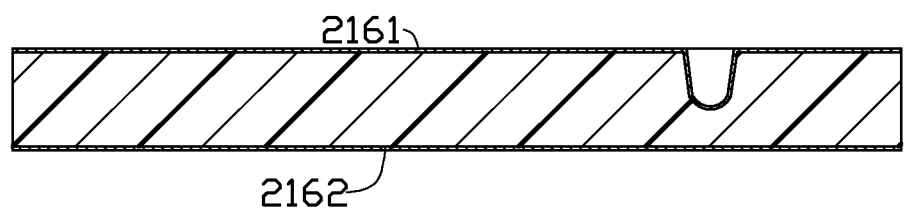
Figure 17:
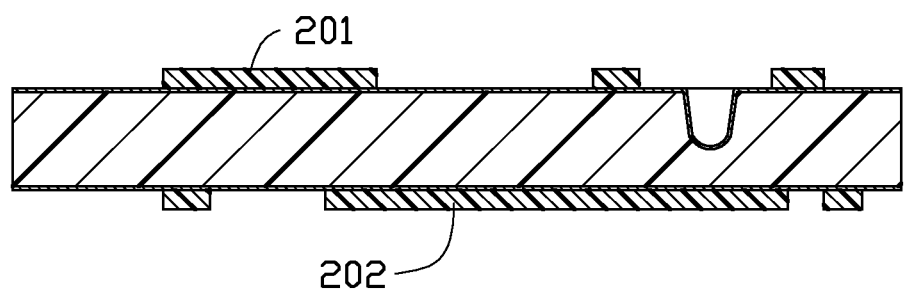
Figure 18:
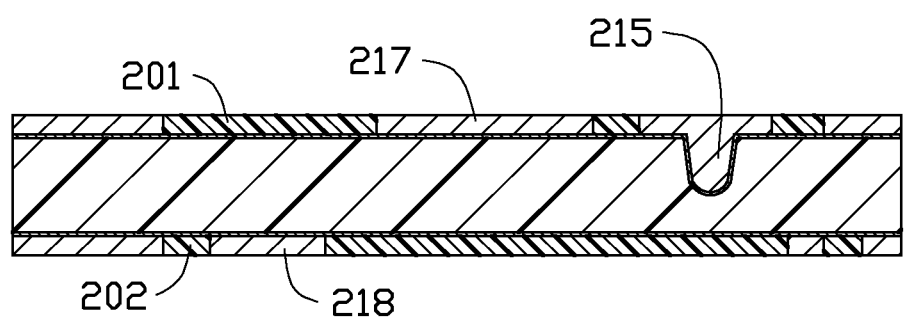
Figure 19:
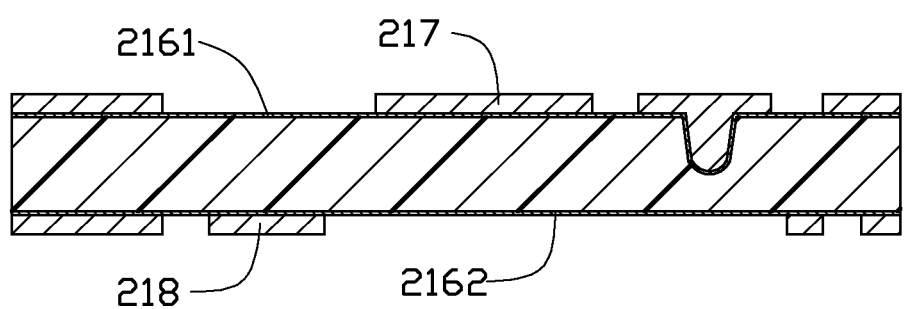

FIG. 14 shows step 2, in which at least one blind hole 214 is defined in the core substrate 210.

The first blind hole 214 can be formed by a laser ablation process. The first blind hole 214 passes through the first copper foil layer 211 and a portion of first dielectric layer 212 adjacent to the first copper foil layer 211. A depth of the first blind hole 214 in the first dielectric layer 212 is in a range from about one half to one three quarters of the thickness of the dielectric layer 212. A number of the first blind hole 214 may be one, and also may be two or more than two.

FIGS. 15-19 shows step 3, in which each first conductive via 215 is formed in one first blind hole 214, and first and second trace layers 220, 230 are formed on the two opposite surfaces of the first dielectric layer 212.

The first conductive via 215, the first trace layer 215, and a second trace layer 230 can be formed by a method below:

Firstly, the first copper foil layer 211 and the second foil layer 213 are removed by a chemical etching processing.

Secondly, a first seed layer 2161 is formed on the inner wall of the first blind hole 214 and on a surface of the first dielectric layer 212, and a second seed layer 2162 is formed on an opposite surface of the first dielectric layer 212.

Thirdly, a first photo-resist pattern 2191 complementary to the first trace layer 220 to be formed is formed on the first electro-plating layer 217, and a second photo-resist pattern 2192 to be formed complementary to the second trace layer 230 is formed on the second electro-plating layer 218.

Fourthly, a first electro-plating layer 217 is formed on the first seed layer 216 exposed from the first photoresist pattern 2191. A second electro-plating layer 218 is formed on the second seed layer 2162 exposed from the second photoresist pattern 2192. A first conductive via 215 is formed on the first seed layer 1161 in the first blind hole 114. The first conductive via 215 is electrically connected with the first electro-plating layer 217.

Finally, the first photoresist pattern 2191, the second photoresist pattern 2192, the first seed layer 2161 covered by the first photoresist pattern 2191, and the second seed layer 2162 covered by the second photoresist pattern 2192 are all removed.

The first trace layer 220 is comprised of the first electro-plating layer 217 and the first seed layer 2161 covered by the first electro-plating layer 217. The second trace layer 230 is comprised of the second electro-plating layer 218 and the second seed layer 2162 covered by the second electro-plating layer 218.

In the present embodiment, both the first trace layer 220 and the second trace layer 230 include a number of traces. There is no trace aligned with the first blind hole 214 in the second trace layer 230.

Figure 20:
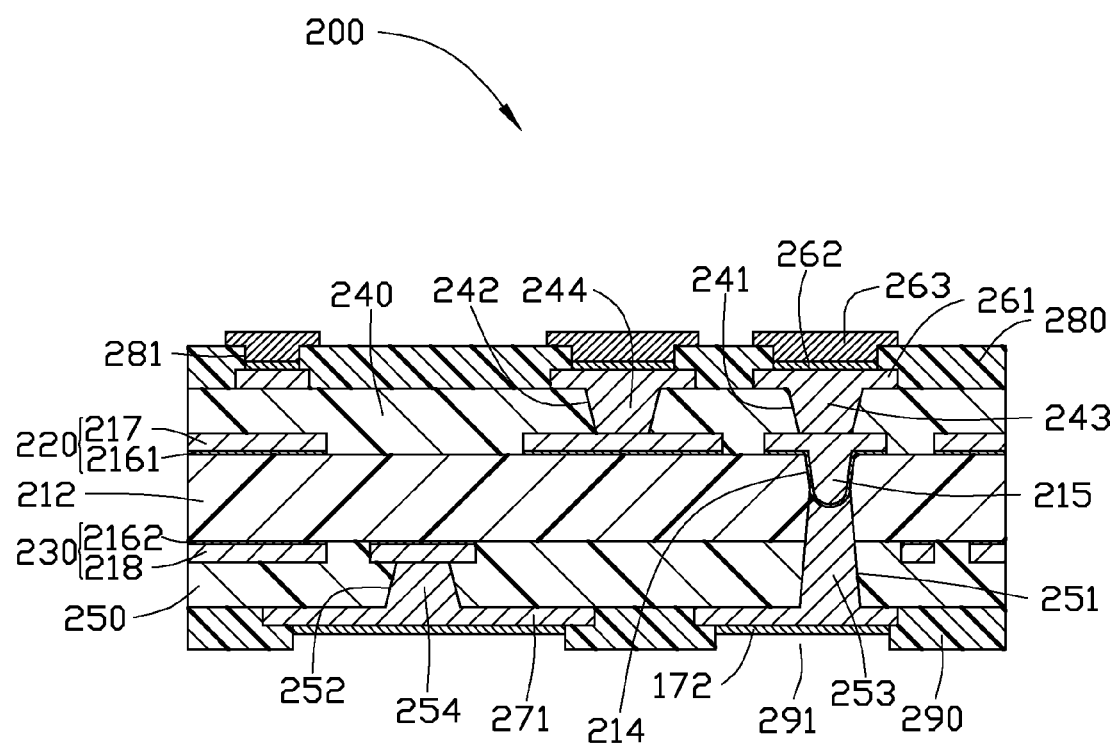
FIG. 20 is a schematic, cross-sectional view of a printed circuit board according to the second exemplary embodiment.

The steps hereafter are similar to steps 4-8 of the first embodiment, to obtain a printed circuit board 200 as in FIG. 20.

A printed circuit board 200 is obtained by the above method as shown in FIG. 20. The printed circuit board 200 includes the first dielectric layer 212, the second dielectric layer 250, the third dielectric layer 240, the first trace layer 220, the second trace layer 230, the third trace layer 270, and the fourth trace layer 260.

The first trace layer 220 and the second trace layer 230 are formed on two opposite surfaces of the first dielectric layer 212. The third dielectric layer is formed on the surface of first trace layer 220 and the surface of the first dielectric layer 210 facing away from the second trace layer 230. The second dielectric layer 250 is formed on the surface of the second trace layer 230 and the surface of the first dielectric layer 212 facing away from the first trace layer 220.

The first trace layer 220 includes the first seed layer 2161 and the first electro-plating layer 217. The first seed layer 2161 contacts the first dielectric layer 212 and the first electro-plating layer contacts the third dielectric layer 240. The second trace layer 230 includes the second seed layer 2162 and the second electro-plating layer 218. The second seed layer 2162 contacts the first dielectric layer 212. The second electro-plating layer 218 contacts the second dielectric layer 250.

The fourth trace layer 260 is formed on the surface of the third dielectric layer 240 facing away from the first dielectric layer 212. The third trace layer 270 is formed on the surface of the second dielectric layer 250 facing away from the first dielectric layer 212.

The first blind hole 214 is defined in the first dielectric layer 212 adjacent to the third dielectric layer 240. The first blind hole 214 does not pass through the first dielectric layer 212. The first conductive via 215 is formed in the first blind hole 214. A second blind hole 251 is defined in the second dielectric layer 250 and the first dielectric layer 212 adjacent to the second dielectric layer 250. The second blind hole 251 is aligned with the first blind hole 214. The first blind hole 214 communicates with the second blind hole 214. The second conductive via 253 is formed in the second blind hole 251 and is electrically connected with the first conductive via 215. The first conductive via 215 is electrically connected with the first trace layer 220, and the second conductive via 251 is electrically connected with the third trace layer 270, such that the first trace layer 220 and the third trace layer 270 are electrically connected with each other by the first conductive via 215 and the second conductive via 251.

The third blind hole 241 and the fourth blind holes 242 are defined in the third dielectric layer 240. The third blind hole 241 is aligned with a first conductive via 215. The fourth blind holes 242 are aligned with the traces of the first trace layer 220. Each third conductive via 243 is formed in one third blind hole 241. Each fourth conductive via 244 is formed in one fourth blind hole 242. A fourth trace layer 260 is formed on the third dielectric layer 240. The first trace layer 220 and the fourth trace layer 260 electrically communicate through the third conductive via 243 and the fourth conductive via 244. Each second conductive via 253 is formed in one second blind hole 251, the second conductive via 253 contacts and is electrically connected with the first conductive via 215. Each fifth conductive via 254 is formed in a fifth blind hole 252. A third trace layer 270 is formed on the second dielectric layer 250. The second trace layer 230 and the third trace layer 270 electrically intercommunicate through the fifth conductive via 254. The first conductive via 215 together with the second conductive via 253 corporately form a blind via. The first trace layer 220 and the third trace layer 270 are electrically connected with each other through the blind via 201. The fourth trace layer 260 and the third trace layer 270 are electrically connected with each other through the blind via 201 together with the third conductive via 243.

The printed circuit board 200 further includes the first solder mask layer 280, the second solder mask layer 290, the first protection layer 262, the solder bumps 263, and the second protection layer 272. A number of first openings 281 are defined in the first solder mask layer 280. Portions of the fourth trace layer 260 exposed in the first openings 281 serving as a number of first connecting pads 261. A second mask layer 290 is formed on a surface of the second dielectric layer 250 and on a surface of the third trace layer 270. A number of second openings 291 are defined in the second solder mask layer 290. Portions of the third trace layer 270 which are exposed in the second openings 291 serving as a number of second connecting pads 271.

The first protection layer 262 is formed on the first connecting pads 261, and the solder bump 263 is formed on the first protection layer 262 on each first connecting pad 261. The solder bump 263 protrudes out of the first solder mask layer 280. The second protection layer 272 is formed on the second connecting pads 271.

A material of the first and second protection layers 261, 271 may be tin, silver, gold, nickel, palladium, a single layer structure made of an alloy of such metals, or a multilayer structure made of a combination of such metals, for example. The first and second protection layers 261, 271 may be made of organic solderable preservative. When the first and second protection layers 261, 271 are made of metal, the first and second protection layers 261, 271 may be formed by electroplating. When the first and second protection layers 261, 271 are made of organic solderable preservative, the first and second protection layers 261, 271 may be formed chemically. A material of the solder bump 260 may be tin, copper, or an alloy of such metals.

In the present embodiment, the first blind hole (whether 114 or 214) is defined in the first dielectric layer (112, 212) and the first conductive via (115, 215) is formed in the first blind hole (114, 214). Then the second blind hole (151, 251) is defined in the second dielectric layer (150, 250) and the first dielectric layer (112, 212) adjacent to the second dielectric layer (150, 250), the second blind hole (151, 251) communicates with the first blind hole (114, 214), the second conductive via (153,253) being formed in the second blind hole (151,251). Thus, the first trace layer (120, 220) and the third trace layer (130, 230) can be electrically connected with each other by the first conductive via (115, 215) and the second conductive via (153, 253). There is thus no need to form a hole ring aligned with the first blind hole (114, 214) in the second trace layer (130, 230). Accordingly, a distribution density of the traces of the second trace layer (130, 230) can be significantly improved.

Furthermore, the first and second conductive vias can be formed by same process, thus the cost of manufacturing the printed circuit board can be reduced.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a printed circuit board, comprising:
  providing a core substrate comprising a first dielectric layer, the first dielectric layer having a first surface and an opposite second surface;
  defining a first blind hole in the first surface of core substrate, the first blind hole extending toward the second surface and terminating at a position between the first and second surfaces of the first dielectric layer;
  forming a first conductive via in the first blind hole;
  forming a first trace layer on the first surface and a second trace layer on the second surface;
  laminating a second dielectric layer on the second trace layer and the first dielectric layer exposed from the second trace layer;
  forming a second blind hole passing through the second dielectric layer and a complementary portion of the first dielectric layer, the first conductive via exposed from the second blind hole; and
  forming a second conductive via in the second blind hole, the second conductive via contacting the first conductive via and being electrically connected with the first conductive via, and forming a third trace layer on a surface of the second dielectric layer, the first trace layer electrically connected with the third trace layer through the first conductive via and the second conductive via.

2. The method of claim 1, wherein a depth of the first blind hole in the first dielectric layer is in a range from a half to three quarters of the thickness of the dielectric layer.

3. The method of claim 1, wherein a third dielectric layer is laminated on the first trace layer when laminating the second dielectric layer.

4. The method of claim 3, further comprising:
  forming a third blind hole and a fourth blind hole in the third dielectric layer, the third blind hole aligned with the first blind hole, the fourth blind hole aligned with a trace of the first trace layer;
  forming a third conductive via in the third blind hole and a fourth conductive via in the fourth blind hole;
  forming a fourth trace layer on a surface of the second dielectric layer facing away from the first dielectric layer, the third conductive via and the fourth conductive via electrically connected with the fourth trace layer, the fourth trace layer electrically connected with the first conductive via through the third conductive via, the fourth trace layer electrically connected with the first trace layer through the fourth conductive via.

5. The method of claim 4, further comprising forming a first solder mask layer on the fourth trace layer, a first opening defined in the first solder mask, a portion of the fourth trace exposed from the first opening serving as an electrically connecting pad.

6. The method of claim 5, further comprising forming a first protection layer on the connecting pad and forming a solder bump on the first protection layer.

7. The method of claim 4, wherein a fifth blind hole is defined in the second dielectric layer when defining the second blind hole, a fifth conductive via is formed in the fifth blind hole when forming the second conductive via, the fifth blind hole is aligned with a trace of the second trace layer, the second conductive via is electrically connected with the second and the third trace layer.

* * * * *